United States Patent [19]

Liu

[11] Patent Number: 5,866,447
[45] Date of Patent: Feb. 2, 1999

[54] MODIFIED ZERO LAYER ALIGN METHOD OF TWIN WELL MOS FABRICATION

[75] Inventor: Chia Chen Liu, Hsinchu, Taiwan

[73] Assignee: Holtek Microelectonics, Inc., Hsinchu, Taiwan

[21] Appl. No.: 739,058

[22] Filed: Oct. 28, 1996

[30] Foreign Application Priority Data

Sep. 6, 1996 [TW] Taiwan .................................. 85110941

[51] Int. Cl.⁶ ............................................... H01L 21/8238
[52] U.S. Cl. ........................ 438/229; 438/199; 438/401; 438/228
[58] Field of Search .................................. 438/227, 228, 438/223, 224, 401, 229, 199

[56] References Cited

U.S. PATENT DOCUMENTS

| | | | |
|---|---|---|---|
| 4,462,151 | 7/1984 | Geipel, Jr. et al. | 438/227 |
| 4,768,883 | 9/1988 | Waldo et al. | 356/401 |
| 5,252,510 | 10/1993 | Lee et al. | 438/401 |
| 5,401,691 | 3/1995 | Caldwell | 438/633 |
| 5,406,373 | 4/1995 | Kamon | 356/401 |
| 5,478,762 | 12/1995 | Chao | 438/143 |
| 5,679,588 | 10/1997 | Choi et al. | 438/401 |

*Primary Examiner*—Michael Trinh
*Attorney, Agent, or Firm*—W. Wayne Liauh

[57] ABSTRACT

A method for fabricating alignment marks in a twin-well integrated circuit without using a zero-layer photomask is disclosed. This method involves the steps of: (a) forming a pad oxide layer on a P-type semiconductor wafer; (b) obtaining an N-well photomask containing an N-well pattern for defining an N-well region in the P-type semiconductor wafer and an alignment mark pattern for defining a plurality of alignment marks in the P-type semiconductor wafer, the N-well photomask is designed such that the alignment mark pattern and the N-well pattern can be separately exposed; (c) using a photolithography technique to expose only the alignment mark pattern to form a plurality of the alignment marks in the pad oxide layer and the P-type semiconductor wafer; (d) coating a first photoresist layer overlaying the pad oxide layer which is aligned using the alignment marks formed in step (b); (e) using the N-well photomask to pattern the first photoresist layer and define the N-well region; and (f) ion-implanting N-type impurities to form the N-well region in the P-type semiconductor wafer.

5 Claims, 4 Drawing Sheets

5,866,447

MODIFIED ZERO LAYER ALIGN METHOD OF TWIN WELL MOS FABRICATION

BACKGROUND OF THE INVENTION (a) Field of the Invention

The present invention relates to a method for the fabrication of integrated circuits (ICs), and more particularly it relates to the method for the fabrication method of alignment marks of a twin-well Metal-Oxide-Semiconductor Field Effect Transistor (MOSFET).

(b) Description of The Prior Art

In order to produce all integrated circuit, the circuit layout patterns are transferred from photomasks to the surface of the silicon wafer using a photolithography process. Each layer followings the zero layer must be carefully aligned to the previous pattern on the wafer. Alignment marks are introduced on each mask and transferred to the wafer as part of the integrated circuit pattern. Computer-controlled alignment equipment called stepper has been developed to achieve the level of sub-micron VLSI process precision (typically 0.6 $\mu$m with ±0.15 $\mu$m tolerance). Various arrangements have been used to position the alignment marks on the photomask (see U.S. Pat. No. 4,768,883 to Waldo et al., the entire disclosure of which is herein incorporated by reference, and U.S. Pat. No. 5,406,373 to Kamon, the entire disclosure of which is also herein incorporated by reference). There are two most commonly used commercial stepper alignment methods in today's VLSI industry: one is developed by ASM company which puts two alignment marks in the middle of the wafer, as shown in FIG. 1A; the other is developed by Nikon company which puts several alignment marks along the X and Y direction scribed lines, as shown in FIG. 1B. The comparisons of those two alignment methods are discussed as follows:

(1) ASM method: The advantage of this method is that it only needs to align two global photolithography alignment marks. This can save alignment operation time, thus increasing the outputs of production lines. However, it requires the fabrication of an extra zero layer mask for every single product to produce global alignment marks, that increases the manufacturing cost.

(2) Nikon method: The advantage of this method is that there are several alignment marks for each die. This can improve the alignment accuracy. On the other hand, it measures ten field positions to take the average of them to achieve better accuracy. This takes longer time for alignment, and thus reduces the outputs of the production. Furthermore, the first layer must be subject to an etching step, otherwise there are no alignment marks for succeeding layers to align.

Because the alignment methods of the ASM stepper and the Nikon stepper are different, one particular twin-well MOS product cannot use both ASM steppers and Nikon steppers for mass-production. If we want to use the ASM stepper alignment method in a Nikon stepper, it would need an extra photomask for zero layer alignment. Therefore, it will not only increase the number of manufacturing steps but also increase the production cost.

SUMMARY OF THE INVENTION

The primary object of the present invention is to provide a new method of fabricating alignment marks in a twin-well MOSFET by adopting the advantages of both ASM and Nikon methods to provide better alignment accuracy in order to monitor the critical dimension (CD) of the succeeding process.

Another object of the present invention is to provide a new method of fabricating alignment marks for a twin-well MOSFET, which only needs two alignment marks near the middle of the wafer to save the alignment time and increase the production line output.

A further object of the invention is to provide a new method of fabricating twin-well MOSFETs which first involves the step of well ion implantation followed by the step of depositing a silicon nitride layer overlying the twin-well region to reduce the number of fabricating steps.

In accordance with these objects of the present invention, a new method of fabricating the alignment marks in a twin-well MOSFET is achieved.

The pad oxide layer is formed in a P-type semiconductor wafer. Then, the global alignment marks near the middle of the wafer are formed by conventional lithography and etching techniques. Next, N-type impurities are doped into the designed area to form the N-well. And, P-type impurities are doped into the area adjacent to N-well to form the P-well.

After well ion-implantation, the impurities in the N-well and P-well regions are thermally driven in a high-temperature environment to the desired depths. Next, the nitride layer is formed overlaying twin-well regions. The alignment method of the succeeding layers then reverts to the Nikon method for better accuracy. An effective alignment mark fabricating method that can use both ASM and Nikon steppers to have good control of critical dimension is accomplished.

BRIEF DESCRIPTION OF THE DRAWINGS

In the accompanying drawings forming a material part of this specification, there is shown.

DESCRIPTION OF THE PREFERRED EMBODIMENT

The invention discloses herein is directed to a method of fabricating alignment marks of a twin-well MOSFET. In the following description, numerous details are set forth in order to provide a thorough understanding of the present invention. It will be obvious, however, to one skilled in the art of integrated circuits that variations of these specific details may be employed to practice the present invention. In other instance, well-known processing steps are not described in detail in order not unnecessarily to obscure the present invention.

Figure 1:
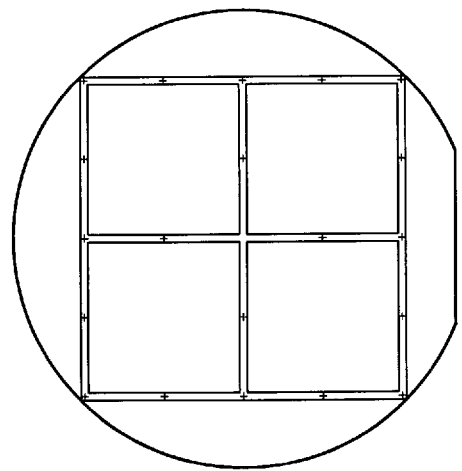
FIGS. 1A and 1B are top views of the alignment marks arrangements of ASM method and Nikon method, respectively.
Figure 1:
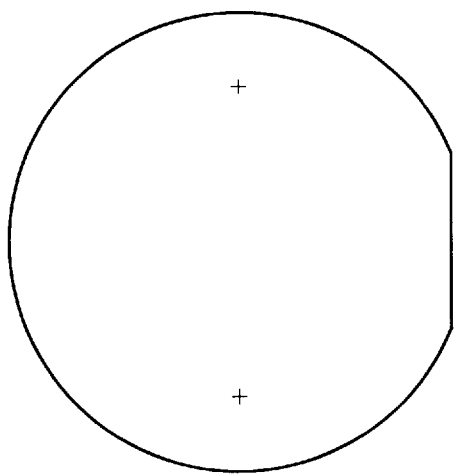
Figure 2:
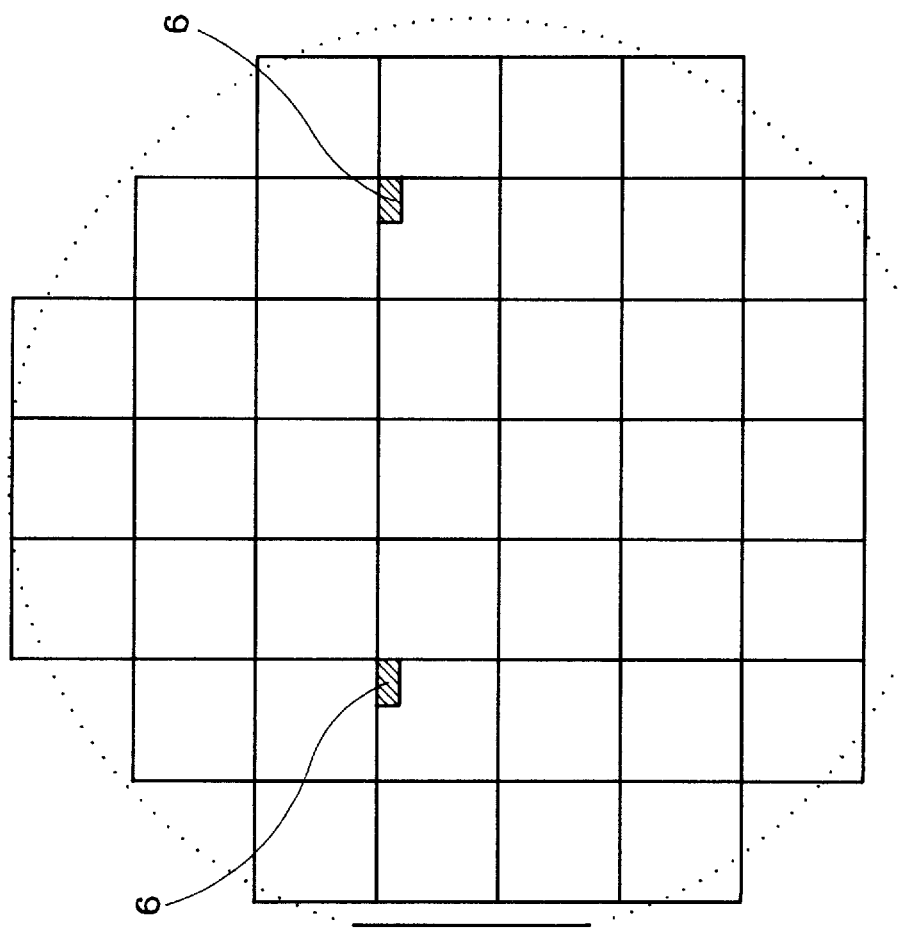
FIG. 2 is a top view showing the arrangement of the alignment marks of the present invention.

Referring now more particularly to FIG. 2, there is illustrated top view of the alignment marks arrangement of the present invention. The positions of the alignment marks are similar to ASM method which involves one alignment mark (6) on each side of the wafer and near the middle of the wafer as the slash regions in FIG. 2. The alignment marks are placed in N-well photomask without fabricating the extra zero layer mask. The alignment processes for N-well, P-well, and nitride layers utilize only these two alignment marks.

Figure 3:
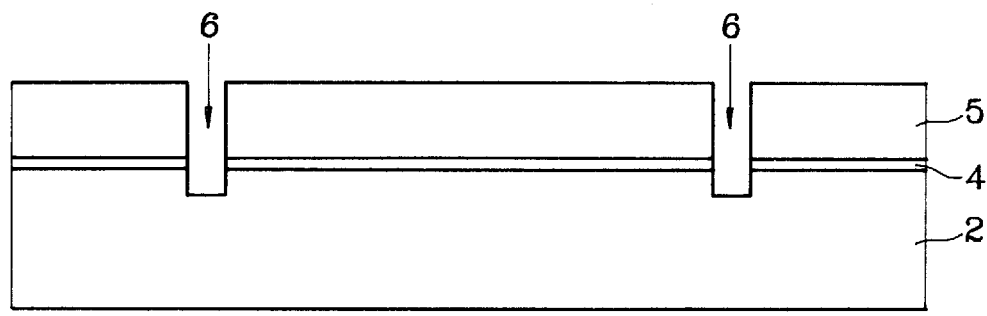
FIG. 3 through 8 schematically illustrate, in cross-sectional representations, the major steps according to a preferred embodiment of the present invention.

Referring now to FIG. 3, there is illustrated the cross sectional view of zero layer alignment mark process. The pad oxide layer (4) is formed on the surface of the P-type semiconductor silicon wafer (2). The thickness of the pad oxide layer is about 250 Angstroms. Then, the zero photoresist layer (5) overlaying the pad oxide layer is coated. Using conventional photolithography and etching techniques, the global alignment marks (6) is formed by only exposing two slash regions of the silicon wafers as shown in FIG. 2. Thereafter, the zero photoresist (5) is stripped by oxygen plasma and sulfuric acid.

Figure 4:
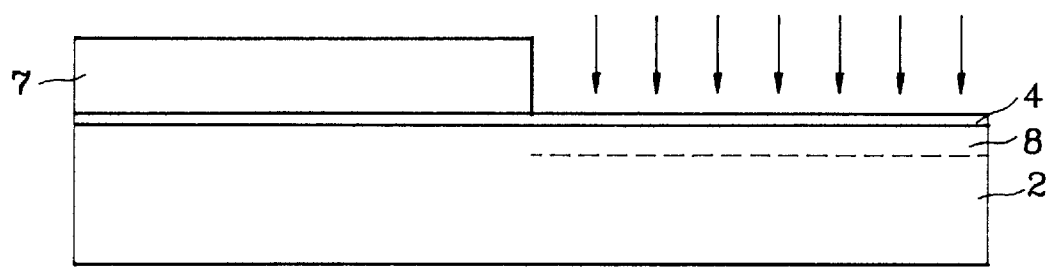

Referring now to FIG. 4, there is illustrated the cross sectional view of the N-well process. The first photoresist layer (7) is formed overlaying pad oxide layer and aligned by the 2-field alignment marks described above. Then, the first photoresist layer is selectively patterned to define N-well region (8). Next, N-type Phosphorus ($P^{31}$) ions are doped into the silicon wafer by ion implantation method. The ion implantation dose is $8 \times 10^{12}$ to $10^{13}$ $cm^{-2}$, with an implantation energy of 150 to 170 keV. Thereafter, the first photoresist is removed.

Figure 5:
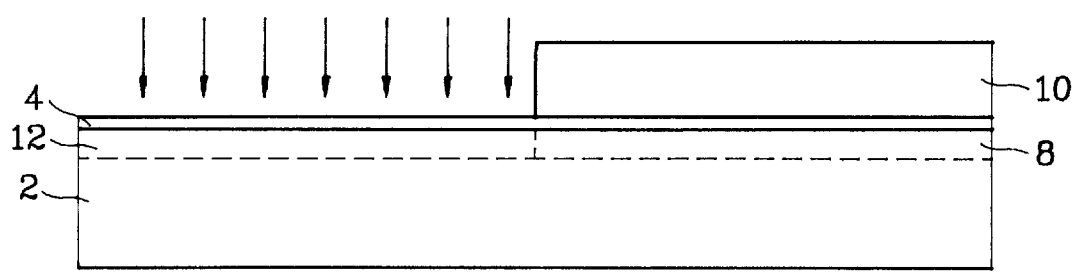

Referring now to FIG. 5, the second photoresist layer (10) is coated and aligned by the 2-field alignment marks described above. Then the second photoresist layer (10) is selectively patterned by lithography technique to define P-well region. Next, P-type Boron ($B^{11}$) ion are doped into the silicon wafer by ion implantation method. The ion implantation dose is $6.5 \times 10^{-12}$ to $8.5 \times 10^{12}$ $cm^{-2}$, with an implantation energy of 80 to 100 keV. Thereafter, the second photoresist layer is removed.

Figure 6:
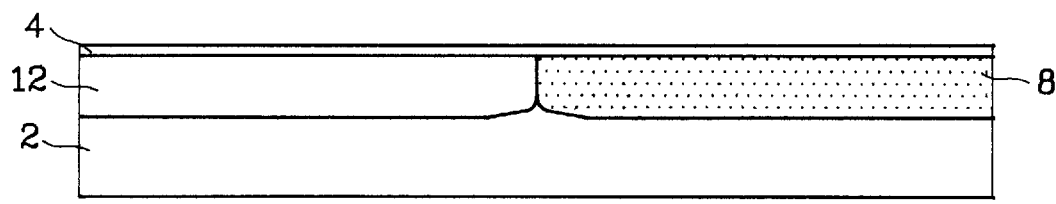

Refer now to FIG. 6, the thermal drive-in a nitrogen and oxygen environment is carried out for the purpose of activating impurities and obtaining the desired depth, to thereby form an N-well region (12) and a P-well region (14), and thus a twin-well.

Figure 7:
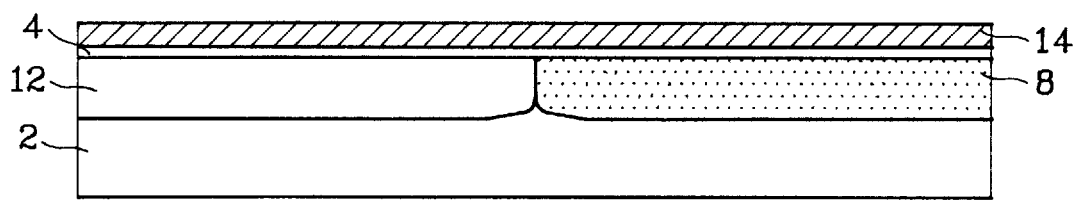

Referring now to FIG. 7, the nitride layer (14) is deposited overlaying the pad oxide layer (12). The nitride layer is formed by low pressure chemical vapor deposition (LPCVD) technique under the following conditions: the base pressure is 350 mTorr, with a temperature of 760° C., and reactant gases $SiH_2Cl_2$ and $NH_3$ flowing.

Figure 8:
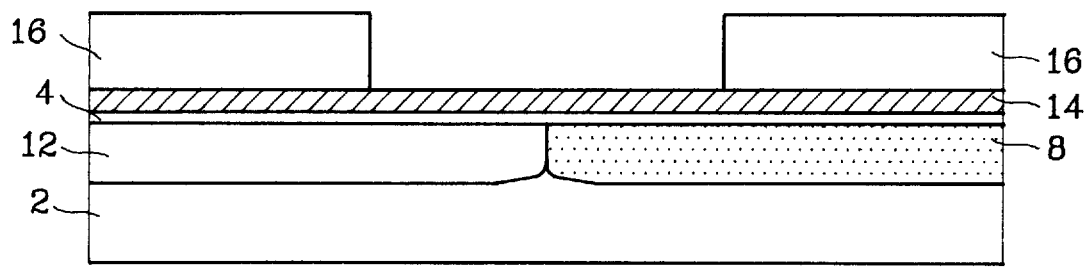

Referring now to FIG. 8, a third photoresist layer 16 is coated overlaying the nitride layer (14). Then the nitride layer (14) is selectively patterned by conventional lithography and plasma-etching techniques in conjunction with a photoresist (16) to define the nitride layer pattern, and aligned by the 2-field alignment marks method described before.

Processing can continue as is conventional in the art to align the succeeding layers by Nikon 10-field alignment marks method to get better alignment accuracy.

There are several advantages according to the twin-well alignment method of the present invention:

(1) It can eliminate the need for making an extra zero layer photomask for global alignment marks as the ASM method would. This can reduce the production cost.

(2) Since the feature sizes of P-well, N-well, and nitride layers are relatively large, the fabrication process only need to align two alignment marks without sacrificing the alignment accuracy before nitride layer is completed, which can reduce the alignment time so as to increase the production outputs.

While the invention has been particularly shown and described with reference to a preferred embodiment, it will be understood by those skilled in the art various changes in form and detail may be made therein without departing from the spirit and scope of the present invention.

What I claimed is:

1. A method for fabricating alignment marks in a twin-well integrated circuit, said twin-well includes an N-well region and a P-well region, and said method comprising the steps of:
   (a) forming a pad oxide layer on a P-type semiconductor wafer;
   (b) obtaining an N-well photomask containing an N-well pattern for defining an N-well region in said P-type semiconductor wafer and an alignment mark pattern for defining a plurality of alignment marks in said P-type semiconductor wafer, said N-well photo mask is designed such that said alignment mark pattern and said N-well pattern can be separately exposed;
   (c) using a photolithography technique to expose only said alignment mark pattern and an etching technique to form a plurality of said alignment marks in said pad oxide layer and said P-type semiconductor wafer;
   (d) coating a first photoresist layer overlaying said pad oxide layer which is aligned using said alignment marks formed in step (b);
   (e) using said N-well photomask to pattern said first photoresist layer and define said N-well region;
   (f) ion-implanting N-type impurities to form said N-well region in said P-type semiconductor wafer;
   (g) removing said first photoresist layer;
   (h) coating a second photoresist layer overlaying said pad oxide layer which is aligned using said alignment marks formed in step (b);
   (i) using a P-well photomask to pattern said second photoresist layer and define said P-well region;
   (j) ion-implanting P-type impurities to form said P-well in said P-type semiconductor wafer;
   (k) removing said second photoresist layer;
   (l) thermally driving in said N-well and said P-well regions to achieve desired depth;
   (m) depositing a nitride layer overlaying said pad oxide layer;
   (n) coating a third photoresist layer overlaying said nitride layer which is aligned using said alignment marks formed in step (b); and
   (o) patterning said nitride layer by conventional lithography and plasma-etching techniques.

2. The method for fabricating alignment marks in a twin-well integrated circuit according to claim 1, which further comprises the step of forming 10 alignment marks after the patterning of said nitride layer.

3. The method for fabricating alignment marks in a twin-well integrated circuit according to claim 1, wherein said N-type impurities are Phosphorus ($P^{31}$) ions, with an ion implantation dose of $8 \times 10^2$ to $10^{13}$ $cm^{-2}$, and an ion implantation energy of 150 to 170 keV.

4. The method for fabricating alignment marks in a twin-well integrated circuit according to claim 1, wherein said P-type impurities are Boron ($B^{11}$) ions, with an ion implantation dose of $6.5 \times 10^{12}$ to $8.5 \times 10^{13}$ $cm^{-2}$, and an implantation energy of 80 to 100 keV.

5. A method for fabricating alignment marks in a twin-well integrated circuit without using a zero-layer photomask, said twin-well includes an N-well region and a P-well region, and said method comprising the steps of:
   (a) forming a pad oxide layer on a P-type semiconductor wafer;
   (b) obtaining an N-well photomask containing an N-well pattern for defining an N-well region in said P-type semiconductor wafer and an alignment mark pattern for defining a plurality of alignment marks in said P-type semiconductor wafer, said N-well photomask is designed such that said alignment mark pattern and said N-well pattern can be separately exposed;

(c) using a photolithography technique to expose only said alignment mark pattern and an etching technique to form a plurality of said alignment marks in said pad oxide layer and said P-type semiconductor wafer;

(d) coating a first photoresist layer overlaying said pad oxide layer which is aligned using said alignment marks formed in step (b);

(e) using said N-well photomask to pattern said first photoresist layer and define said N-well region; and (f) ion-implanting N-type impurities to form said N-well region in said P-type semiconductor wafer.

* * * * *